United States Patent [19]
Sugasawara

[11] Patent Number: 6,043,672
[45] Date of Patent: Mar. 28, 2000

[54] SELECTABLE POWER SUPPLY LINES FOR ISOLATING DEFECTS IN INTEGRATED CIRCUITS

[75] Inventor: Emery O. Sugasawara, Pleasanton, Calif.

[73] Assignee: LSI Logic Corporation, Milpitas, Calif.

[21] Appl. No.: 09/078,188

[22] Filed: May 13, 1998

[51] Int. Cl.[7] .................................................. G01R 31/26
[52] U.S. Cl. ........................................... 324/765; 324/763
[58] Field of Search .................................... 324/763, 765; 714/724, 733, 734

[56] References Cited

U.S. PATENT DOCUMENTS

| | | | |
|---|---|---|---|
| 5,025,344 | 6/1991 | Maly et al. | 361/88 |
| 5,532,174 | 7/1996 | Corrigan | 437/8 |
| 5,550,841 | 8/1996 | O'Brien | 371/22.1 |
| 5,644,251 | 7/1997 | Colwell et al. | 326/16 |
| 5,670,890 | 9/1997 | Colwell et al. | 324/765 |
| 5,712,576 | 1/1998 | Nagataki | 324/763 |
| 5,969,538 | 10/1999 | Whetsel | 324/763 |

OTHER PUBLICATIONS

IBM Microelectronics, Defect Localization—Fault Isolation, at http://www.chips.ibm.com/services/asg/capabilities/asweb07.html, 10 pages (Mar. 26, 1988).

IBM Microelectronics, Enhance VLSI functional failure analysis with IDDQ current measurements, at http://www.chips.ibm.com/services/asg/appnotes/app01.html, 3 pages (Mar. 26, 1988).

*Primary Examiner*—Josie Ballato
*Assistant Examiner*—Russell M. Kobert
*Attorney, Agent, or Firm*—H Shannon Tyson, Jr.

[57] ABSTRACT

An integrated circuit providing selectable power supply lines for isolating defects manifested by unusual quiescent current levels. During normal operation, a unitary power supply line provides power to different sections of the integrated circuit. In accordance with the present invention, the unitary power supply line is decoupled from the sections of the integrated circuit and power is provided by the selectable power supply lines during failure analysis of the integrated circuit. A section of interest of the integrated circuit is first placed in a static test state in which defects in the section may produce unusual quiescent current levels. A selectable power supply line for providing power only to the specified section of the integrated circuit is the activated by an enable signal provided to a switch coupled to the selectable power supply line. The switch allows for decoupling of the unitary power supply line from the selectable power supply line. By powering the section of interest with a dedicated power supply line, automated test equipment (ATE) can be utilized during production testing to identify areas of unusual quiescent current consumption and defect localization time for the integrated circuit is significantly reduced.

22 Claims, 5 Drawing Sheets

SELECTABLE POWER SUPPLY LINES FOR ISOLATING DEFECTS IN INTEGRATED CIRCUITS

BACKGROUND OF THE INVENTION

1. Field of the Invention

The invention relates to testing of semiconductor devices, and more particularly to selectable power supply lines for use in isolating defects in integrated circuits.

2. Description of the Related Art

Integrated circuits (ICs) have become key components of many consumer and commercial electronic products, often replacing discrete components and enhancing product functionality. The semiconductor processing technologies that produce these integrated circuits have advanced to the point where complete systems can often be reduced to a single integrated circuit. These integrated circuits (also referred to as "chips") may use many functions that previously could not be implemented together on a single chip, including: microprocessors, digital signal processors, mixed signal and analog functions, communication circuitry, and large blocks of memory and high speed interfaces. It is a common practice for the manufacturers of such integrated circuits to thoroughly test device functionality at the manufacturing site. However, the complex nature of today's integrated circuits presents new testing challenges. Continually shrinking device geometries, coupled with the high cost of operating semiconductor processing equipment, result in increased demands on integrated circuit suppliers to improve process yields through developing new test strategies.

Currently, complementary metal-oxide-semiconductor (CMOS) is the most popular technology for fabricating integrated circuits due to its inherent low power consumption in high density designs. CMOS circuits use complementary p-channel metal-oxide-semiconductor field-effect (PMOS) transistors and n-channel metal-oxide-semiconductor field-effect (NMOS) transistors to produce fully static designs that ideally consume no power except when switching states. In practice, however, CMOS circuits consume low leakage or quiescent currents—also referred to as quiescent power supply current or IDDQ—in a static state.

If an integrated circuit should fail, in many cases unusual current levels can be detected, typically in the form of excessive amounts of quiescent current The excessive amounts of quiescent current occur when a manufacturing defect causes the integrated circuit to be ill-conditioned to quiescent current test states.

Many general test development strategies for integrated circuits have evolved, and often combinations of these strategies are utilized to provide a high degree of fault coverage. Test development strategies include functional test wherein automatic test equipment (ATE) test programs are performed in which the circuit under test is stimulated with specified inputs while the outputs are monitored to determine if they correspond with simulated logic values.

Another test development strategy, physical defect testing, involves creating specific tests designed to detect possible real physical defects that can occur in a circuit. Physical testing is useful for detecting defects that may not cause the device to fail functional or structural testing, but may lead to failure in the field. Defects in integrated circuits take many forms, some of which are test pattern sensitive. Gate oxide defects, drain to source current leaks (punch-through), and p-n junction current leaks (such as drain or source to diffusion current leaks) tend to be pattern sensitive, while resistive shorts to ground or the power supply voltage are usually pattern insensitive. In either case, quiescent current tests are a valuable tool in detecting faults.

Generally, the result of test development is an ATE test program or test "set" providing stimulus/response test "vectors" in the language of the ATE. The ATE test set causes the inputs of the device under test to be driven in a predetermined manner, while output pin voltages are compared to stored test values. The ATE test set is derived mainly from functional and structural test development logic simulations.

When testing quiescent current with a functional test set, the tester is generally halted at predetermined test steps suitable for quiescent current testing. Once halted (i.e., no transistor state switching is occurring) the power supply of the device under test is measured by the ATE and the resulting value is compared to predetermined reference values or test limits. Such quiescent current tests are effective in detecting many faults that would otherwise not be found by other test strategies.

For example, with most functional tests that measure voltage, faults must propagate to the output pins of the device under test for the ATE to differentiate between a good or bad device. Quiescent current tests differ in that current is sensed rather than voltage, providing a simple means to monitor the entire circuit or portions thereof for over-current conditions. The quiescent current measurements are typically accomplished via the tester's parametric unit.

Accurate quiescent current testing requires that the device under test be in a static DC condition, with any circuitry that consumes current in the static DC condition being disabled or accounted for in the test limits. Preferably analog circuitry, input/output pads, and other circuitry not conducive to quiescent current testing are provided with separate, dedicated power supply inputs, so that digital core circuitry can be tested separately.

In order to isolate the defective area of an integrated circuit, a failure analysis engineer seeks to determine which section of the integrated circuit is responsible for unusual current levels. Quiescent current testing to detect which section of an integrated circuit includes a defect, however, has been complicated by current distributed within other sections of the integrated circuit, particularly sections in the same region of the integrated circuit. One known approach to this problem has been the procedure of cutting lines and/or depositing additional metal for "jumpering" lines to condition the desired section of an integrated circuit for a quiescent mode. This approach has typically included measuring current in a region of the integrated circuit, cutting lines to sections within the same region other than the section of interest, and then taking a additional measurements of current in the region.

Such failure analysis techniques have not adequately localized defects in particular regions of an integrated circuit. Certain sections of an integrated circuit, such as sections in the same region of an integrated circuit, often share common (or unitary) power supply lines. It has been difficult to isolate a particular section having a defect from other sections in the same region of the integrated circuit which share power supply lines.

Other related failure analysis approaches include photon emission microscopy, E-beam testing, backside infrared imaging, and optical beam induced current techniques. Photon emission microscopy typically involves use of an emission microscope sensitive to electron-hole recombination. When an electron hole recombination occurs, some of the excess energy is given off as photon emission. Photon emission microscopy is primarily effective for detection of a unique subset of leakage type failures and semiconductor overstress conditions. In E-beam testing, a variety of voltage characterization techniques (such as state voltage contrast, dynamic fault imaging, and electron beam involved current) in conjunction with functional stimulus are used to collect data for locating physical defects.

With backside infrared imaging, the backside of a die is exposed to infrared emissions to induce current. A laser scanning microscope is then used to observe those areas of the die of relatively high heat dissipation which will reflect infrared energy. In optical beam induced current techniques, a laser is used to scan energy across a sample to generate electron-hole pairs. The electron-hole pairs become swept up by the voltage across the space-charge regions in the sample. The resulting current is amplified to generate an image. The current-generated image may be superimposed on the reflected light image to correlate the current to a physical location which is often associated with a defective site. Many of these testing techniques, however, are time consuming and cannot be utilized in conjunction with ATE test programs.

SUMMARY OF THE INVENTION

Briefly, the present invention provides selectable power supply lines for isolating defects in integrated circuits. A selectable power supply line for providing power to a particular section of the integrated circuit is activated by an enable signal provided to a selectable power supply switch coupled to the selectable power supply line. The enable signal may also be provided to a additional power supply switches coupled to a unitary power supply line. The power supply switches allow for decoupling of the unitary power supply line from the selectable power supply line(s).

During an ATE testing procedure, the particular section of interest is initially placed in a static test state in which defects within the section may produce unusual quiescent current levels. The selectable power supply line for the particular section is enabled to provide power to the particular section of interest without also powering other sections in the same region of the integrated circuit. By monitoring quiescent current in the selectable power supply line, areas of unusual quiescent current consumption can be readily identified. Thus, the use of selectable power supply lines in accordance with the invention permit a failure analysis engineer to significantly reduce defect localization time for an integrated circuit.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

The following patent application is hereby incorporated by reference as if set forth in its entirety:

Commonly-assigned U.S. patent application Ser. No. 09/022,353, entitled "REDUCED VOLTAGE QUIESCENT CURRENT TEST METHODOLOGY FOR INTEGRATED CIRCUITS," attorney reference number A97352US, filed on Feb. 11, 1998, now pending.

Figure 1:
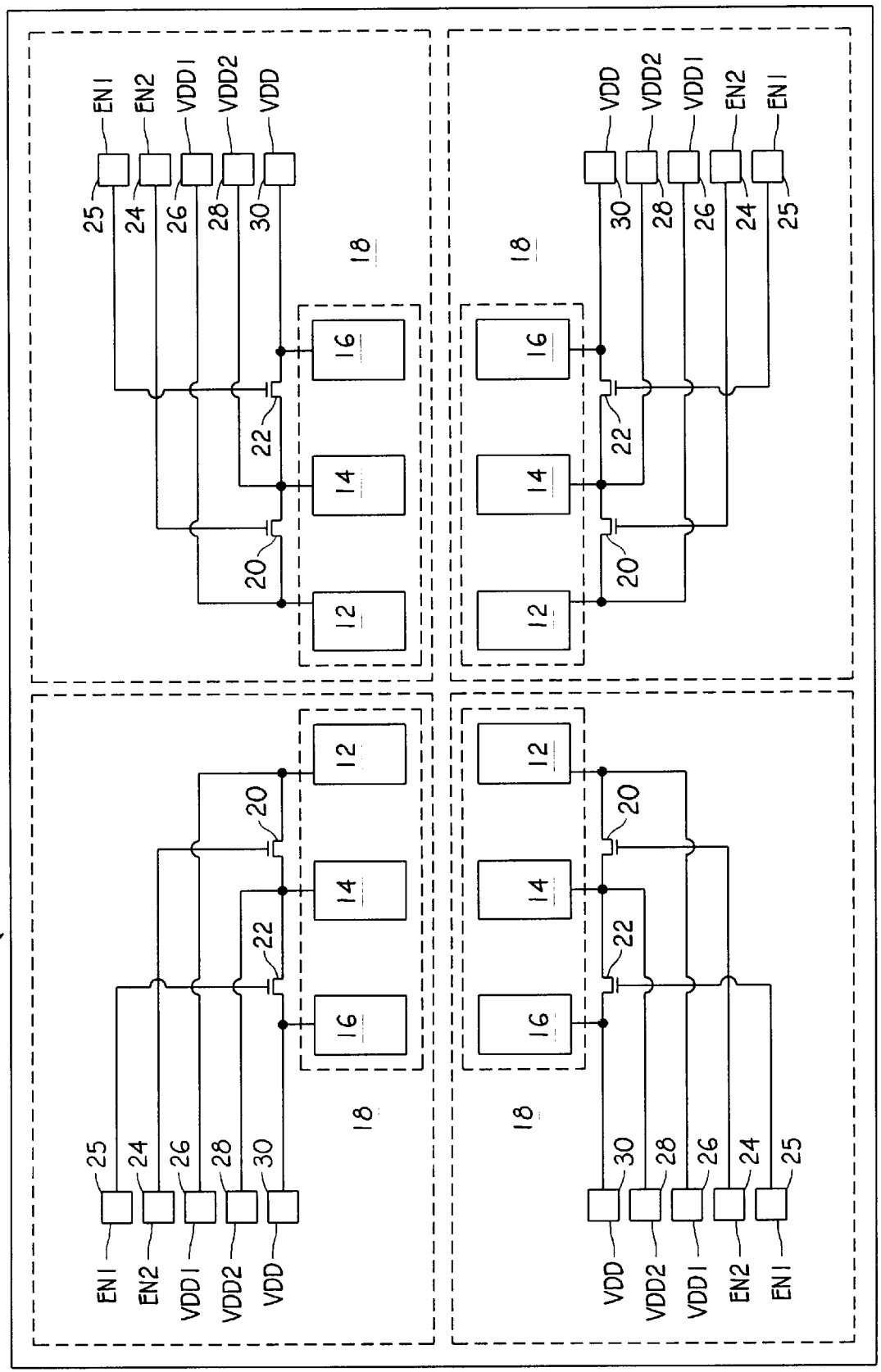
FIG. 1 is a schematic diagram of an integrated circuit configured with multiple selectable power supply lines for failure analysis in accordance with the present invention.

Referring to FIG. 1, a schematic diagram of an integrated circuit 10—such as an application specific integrated circuit (ASIC) device—configured for failure analysis in accordance with the present invention is shown. The integrated circuit 10 is "compartmentalized" into various regions 18 (logical groupings of circuitry), each of which include multiple sections 12, 14, and 16. Although four regions 18 are depicted, those of skill in the art will recognize that the integrated circuit 10 may include one or more regions 18, depending on the nature of the integrated circuit 10.

During normal operation, the sections 12, 14 and 16 of a region 18 share a common (or unitary) power supply line or bus associated with a common power supply pad VDD 30. Additional selectable power supply pads VDD1 26 and VDD2 28 may also be used to supply power to the region 18 during normal operation, with the power supply pads being coupled to an external power supply (not shown). In a selectable power mode according to the invention, a section of interest within the region 18 is decoupled from the common power supply line (VDD 30) and coupled to an isolated power supply pad.

In the illustrated embodiment, during a selectable power mode, a section 12 may be powered by a power supply line coupled to the selectable power supply pad VDD1 26. In addition, a section 14 may be powered by a power supply line associated with the selectable power supply pad VDD2 28. A selectable power mode for sections 12 and 14 is entered by applying a first enable signal at a selectable power enable pad EN1 25. The selectable power supply enable pad EN1 25 provides the first enable signal to a selectable power supply switch 22 coupled to section 14. When asserted, the first enable signal opens the selectable power supply switch 22, thereby internally decoupling the common power supply pad VDD 30 from the power supply pads VDD1 26 and VDD2 28.

Similarly, a second enable signal is applied at a selectable power supply enable pad EN2 24. The selectable power supply enable pad EN2 24 provides the second enable signal to a selectable power supply switch 20 coupled to section 12. When asserted, the second enable signal opens the selectable power supply switch 20, thereby internally decoupling the power supply pads VDD1 26 and VDD2 28. The selectable power mode for sections 12 and 14 is disabled by deassertion of the first and second enable signals at the selectable power supply pads EN1 25 and EN2 24.

In the disclosed embodiment of the invention, the selectable power supply switches 20 and 22 are implemented as complementary-metal-oxide-semiconductor (CMOS) pass transistors. The selectable power supply switches 20 and 22 are wider than the transistors generally used in the internal logic of the integrated circuit 10 in order to provide a low on-resistance relative to the typical resistance of a power supply line for an integrated circuit 10. The techniques for designing such transistors will be appreciated by one of ordinary skill in the art of integrated circuit design.

By separating a power supply for a particular section of an integrated circuit 10 in accordance with the present invention, a failure analysis engineer may more readily isolate defects in a region of interest in the integrated circuit 10. By placing a particular section of an integrated circuit in a selectable power mode, such that the particular section is powered and other sections in the same region are not powered or are powered by separate power supply pads, any unusual current levels representing defects in the particular section may be isolated. As described more fully below, the isolation process may be accomplished during production test programs by utilizing parametric measurement capabilities of automated test equipment (ATE) to determine current required by an individual power supply pad(s), and hence the current required by associated integrated circuitry.

Figure 2:
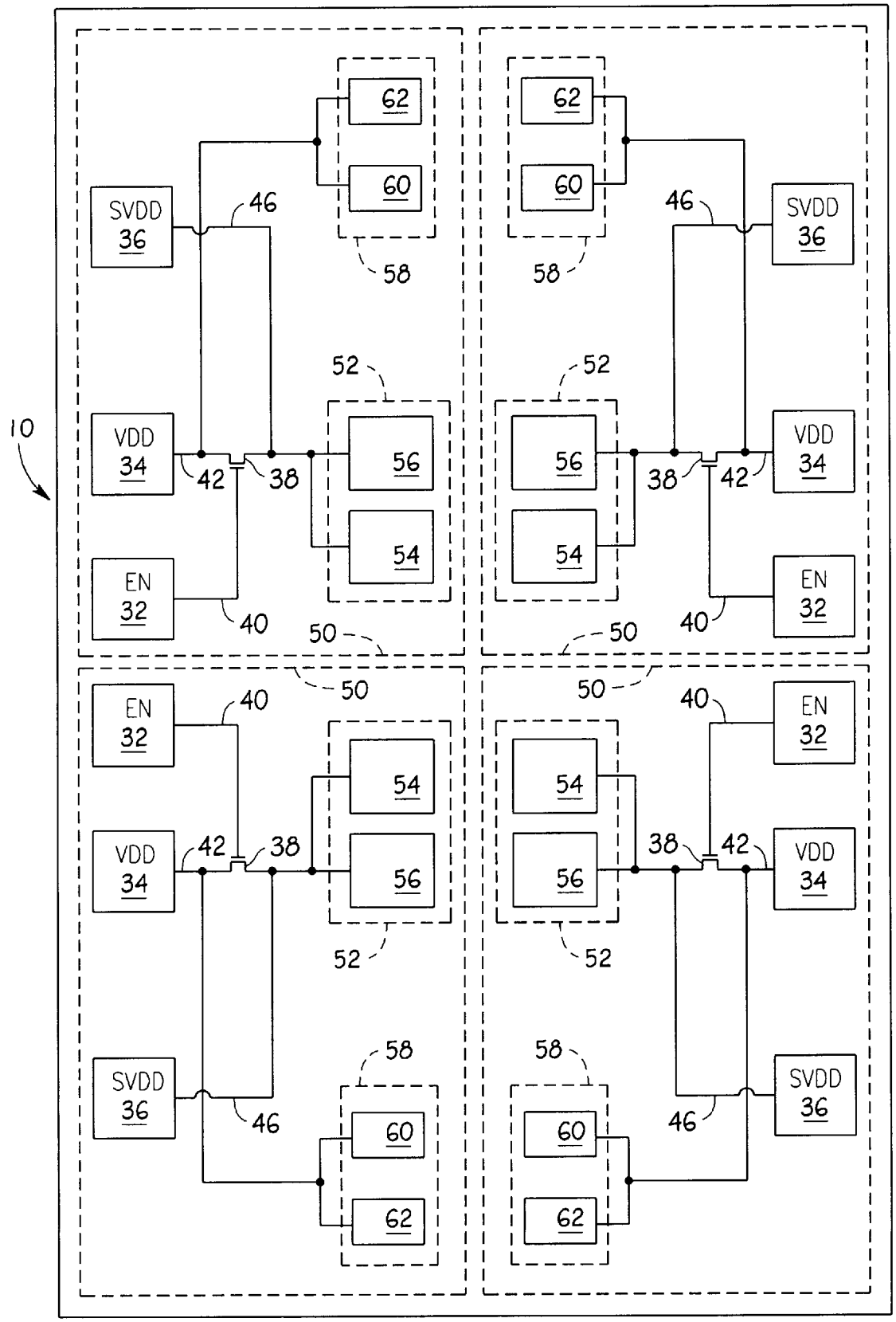
FIG. 2 is a schematic diagram of an integrated circuit configured with a single selectable power supply line for failure analysis in accordance with the present invention.

The disclosed isolation technique is particularly useful for areas of an integrated circuit which tend to be sensitive to process variations, such as random access memories (RAMs). A selectable power supply line, for example, may be used for defect isolation between a RAM section and a logic section in the same region of an integrated circuit (FIG. 2). As another example, a selectable power supply may be used for defect isolation between one RAM section and another RAM section in the same region of an integrated circuit. It should be understood that a single selectable power supply may be used to isolate a defect between two sections in a region of an integrated circuit or multiple selectable power supplies may be used for defect isolation among multiple sections in a region of an integrated circuit.

Referring to FIG. 2, a schematic diagram of an alternative embodiment of an integrated circuit 10 configured for failure analysis in accordance with the present invention is shown. In the illustrated embodiment, during a selectable power mode, a section 52 (such as a RAM memories) is powered by a power supply line 46 associated with a selectable power supply pad SVDD 36. A selectable power mode for section 52 is entered into by applying an enable signal at a selectable power enable pad EN 32. The selectable power enable pad EN 32 provides the enable signal to open a selectable power supply switch 38 coupled to section 52 by the selectable power supply line 46. During the selectable power mode, section 58 is powered solely by a common power supply line 42 associated with a common power supply pad VDD 34. When the selectable power supply switch 38 is closed during normal operation, both sections 52 and 58 are powered by the common power supply pad VDD 34, and may also receive power from the selectable power supply pad SVDD 36.

Section 52 as illustrated includes a RAM block 54 and a block 56. It should be understood that a section of an integrated circuit may be divided into a plurality of such blocks. Section 58 is divided into logic rows 60 and 62. It should further be understood that a section of an integrated circuit may be divided into a plurality of such logic rows. The precise nature of the various sections 52 and 58 is not considered critical to the invention.

Although the current consumed by section 58 may be measured by opening the selectable power supply switch 38 and measuring the current at the common power supply pad VDD 34, other variations are contemplated. For example, when the selectable power mode is disabled for section 52, current within the entire region 50 can be measured at the common power supply pad VDD 34. Current may then be isolated between section 52 and section 58 by opening the selectable power supply switch 38. In this selectable power mode, only the selectable power supply line 46 provides power to section 52. Current in section 52 is then measured at the selectable power supply pad SVDD 36.

The difference between the current measured at the common power supply pad VDD 34 when the selectable power mode for section 52 is disabled (i.e., switch 38 is closed) and current measured at the selectable power supply pad SVDD 36 when the selectable power mode for section 52 is enabled represents the current within section 58. A selectable power supply thus permits a failure analysis engineer to differentiate current in two sections of an integrated circuit 10 that typically share a power supply line. It should be understood that current in two sections may be isolated by providing selectable power supply pads for either section. Further, for an integrated circuit 10 in which extra power supply pads are unavailable, a single pad may be multiplexed so as to serve as a common power supply pad VDD 34 when the selectable power mode is disabled and as a selectable power supply pad SVDD 36 when the selectable power mode is enabled. If this approach is taken, care should be utilized to avoid potential "latch-up" conditions in the integrated circuitry.

Figure 3:
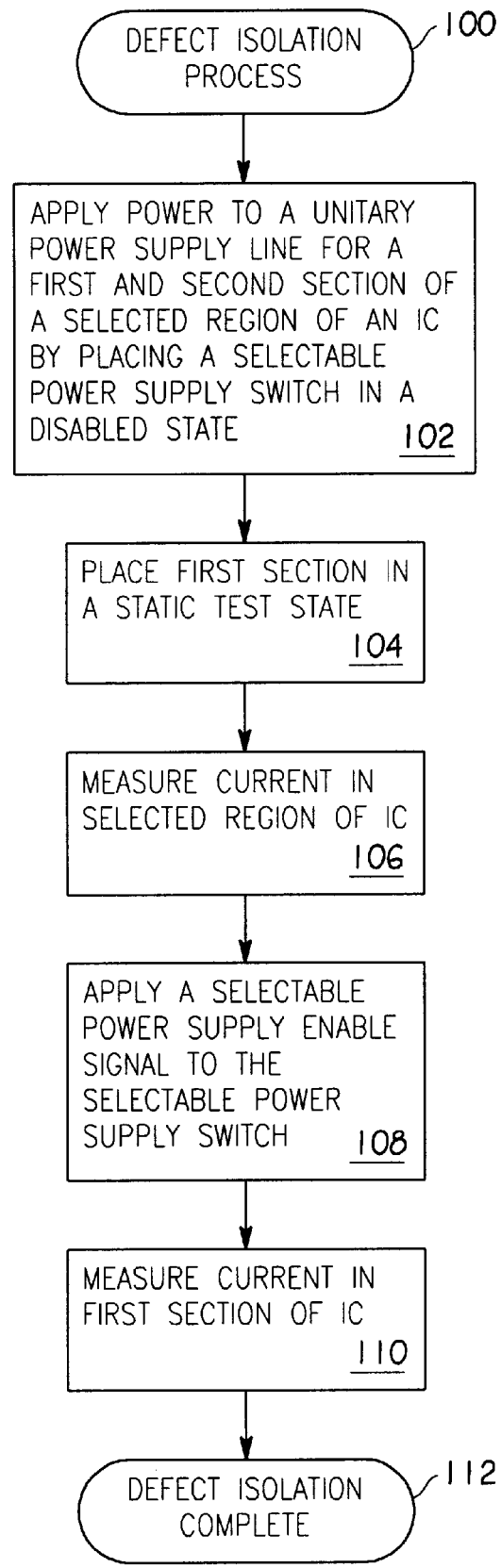
FIG. 3 is a flow chart of a defect isolation process using the selectable power supply embodiment of FIG. 2.

Referring to FIG. 3, a flow chart of a defect isolation process 100 using the selectable power supply embodiment of FIG. 2 is shown. The process begins at step 102 where power is applied to the unitary power supply line 42 for a first section 52 and a second section 58 of a selected region 50 of the integrated circuit 10 by placing the selectable power supply switch 38 in a disabled (i.e., closed) state. The disabled state of the selectable power supply switch 38 corresponds to a disablement of the selectable power mode for the first section 52. Next, in step 104, the first section 52 (or, alternatively, the entire integrated circuit 10) is placed in a static test state. In the static test state, the circuits within an integrated circuit 10 consume quiescent currents. As noted, physical defects may be identified by detecting abnormally high levels of quiescent current. Quiescent current testing of integrated circuits is discussed generally in the previously incorporated U.S. Patent Application entitled "REDUCED VOLTAGE QUIESCENT TEST METHODOLOGY OF INTEGRATED CIRCUITS." In step 106, current is measured in the selected region 50 of the integrated circuit 10. This current measurement may be measured directly by automated test equipment, or may be measured manually by a failure analysis engineer applying a test probe to the common power supply pad VDD 34.

Next, in step 108, an enable signal is applied to the selectable power supply switch 38 to place the first section 52 in a selectable power mode. As described above, during a selectable power mode of the first section 52, the first section 52 and the second section 58 are powered by separate power supply pads.

In step 110, current consumption in the first section 52 is measured, preferably by ATE. This current measurement may also be taken by applying a test probe to the selectable power supply pad SVDD 36. At step 112, the defect isolation process is complete. By comparing the current measurements taken in steps 106 and 110, a failure analysis engineer can readily identify any sections of an integrated circuit 10 that have a physical defect(s) causing abnormal quiescent currents.

Figure 4A:
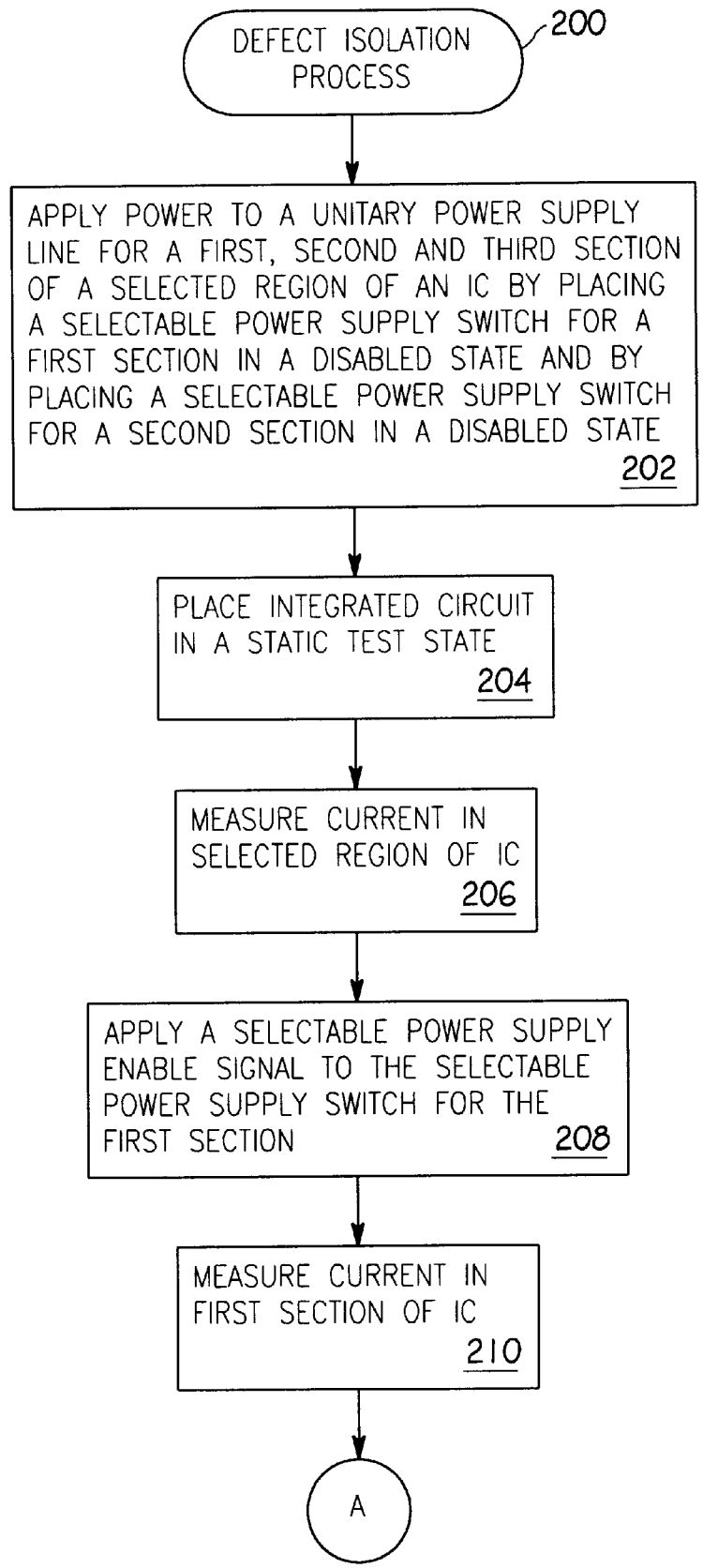
FIGS. 4A and 4B provide a flow chart of a defect isolation process using the selectable power supply embodiment of FIG. 1.
Figure 4B:
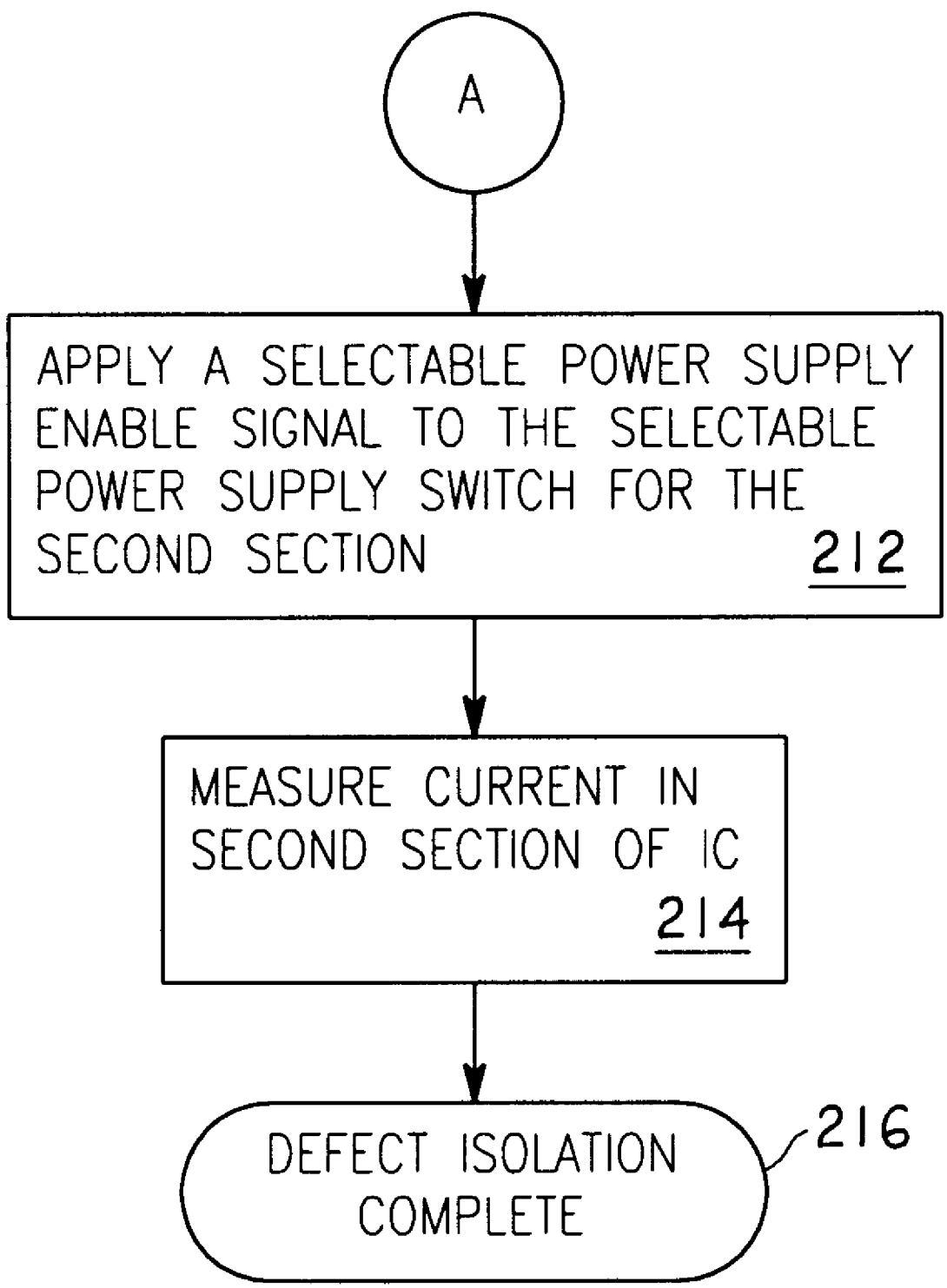

Referring to FIGS. 4A–4B, a flow chart of a defect isolation process 200 using the selectable power supply embodiment of FIG. 1 is shown. While the defect isolation process of FIG. 3 isolates a defect from a region containing two sections, the isolation defect process of FIGS. 4A–4B isolates a defect from a region containing three sections. The process begins at step 202, where power is applied to the unitary or common power supply line (VDD 30) for a first section 12, a second section 14, and a third section 16 of selected region 18 of the integrated circuit 10. Power is applied to the common power supply line by placing the selectable power supply switch 20 for the first section 12 in a disabled (closed) state and the selectable power supply switch 22 for the second section 14 in a disabled (closed) state.

Next, in step 204, the logic of the selected region 18 is placed in a static test state. Preferably, all other portions of the integrated circuit 10 are also placed in a static test state. Again, circuits within an integrated circuit 10 typically consume relatively low quiescent currents during a static test state. In step 206, current in the selected region 18 is measured via ATE parametric measuring equipment. This current measurement may also be taken by applying a test probe to the common power supply pad VDD 30.

Next, in step 208, a first enable signal is asserted to the selectable power supply switch 20. The enabled (open) state of the selectable power supply switch 20 corresponds to the selectable power supply mode of the first section 12. With the first section 12 in its selectable power mode, current is measured in the first section 12 in step 210. This current measurement may be taken by ATE or a test probe coupled to the selectable power supply pad VDD1 26.

In step 212, a second enable signal is applied to the selectable power supply switch 22, thereby opening the switch 22 and isolating the power supply line for the second section 14. The power supply pad VDD2 28 provides power to the second section 14 during this selectable power mode. With the second section 14 in its selectable power mode, quiescent current consumption is next measured in the second section 14 in step 214. Again, this current measurement may be taken by ATE or by applying a test probe to the selectable power supply pad VDD2 28. At step 216, the defect isolation process is complete. By comparing the current measurements taken in steps 210 and 214, a failure analysis engineer can readily identify any sections of the integrated circuit 10 having a defect that causes abnormal quiescent currents. It should be understood that the present invention may be used for isolating a defect in a region containing any number of sections.

Thus, selectable power supply lines for isolating defects in integrated circuits have been described. The selectable power supply lines allows for decoupling of a unitary power supply line from a selectable power supply line coupled to a specified portion of an integrated circuit. During an ATE testing procedure according to the invention, the particular section of interest is initially placed in a static testing state in which defects within the section may be manifested by unusual quiescent current levels. By monitoring quiescent current in the corresponding selectable power supply line, areas of unusual quiescent current consumption can be readily identified. The use of selectable power supply lines in accordance with the invention thereby permits a failure analysis engineer to significantly reduce defect localization time for an integrated circuit.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for isolating defects in an integrated circuit, comprising the steps of:

providing a unitary power supply line for powering a first section and a second section of the integrated circuit;

providing a first selectable power supply line for powering the first section of the integrated circuit;

providing a first selectable power supply switch for electrically coupling and decoupling the unitary power supply line and the first section of the integrated circuit, the first selectable power supply switch being responsive to an enable signal;

placing the first section of the integrated circuit in a static test state conducive to quiescent current measurement;

asserting an enable signal to the first selectable power supply switch for switching the first selectable power supply switch from a closed state to an open state to electrically decouple the unitary power supply line and the first section of the integrated circuit; and measuring the current supplied by the first selectable power supply line to determine quiescent current in the first section of the integrated circuit.

2. The method of claim 1, further comprising the step of:

measuring the current supplied by the unitary power supply line to determine quiescent current in the second section of the integrated circuit.

3. The method of claim 1, further comprising the steps of:

deasserting the enable signal to the first selectable power supply switch for switching the first selectable power supply switch from an open state to a closed state to electrically couple the unitary power supply line and the first section of the integrated circuit;

placing the second section of the integrated circuit in a static test state conducive to quiescent current measurement;

measuring the current supplied by the unitary power supply line to determine quiescent current in the region of the integrated circuit including the first and second section; and comparing the measured current supplied by the first selectable power supply line and the measured current supplied by the unitary power supply line to determine the quiescent current in the second section of the integrated circuit.

4. The method of claim 1, the step of measuring the current supplied by the first selectable power supply line comprises:

configuring automated test equipment to perform parametric measuring of the current during a production test program.

5. The method of claim 1 wherein the region of the integrated circuit further includes a third section, the method further comprising the steps of:

providing the unitary power supply line for further powering the third section of the integrated circuit;

providing a second selectable power supply line for powering the second section of the integrated circuit;

providing a second power supply switch for electrically coupling and decoupling the unitary power supply line and the second section, the second selectable power supply switch being responsive to a second enable signal placing the second section of the integrated circuit in a static test state conducive to quiescent current measurement;

asserting the second enable signal to the second selectable power supply switch for switching the second selectable power supply switch from a closed state to an open state to electrically decouple the unitary power supply line and the second section of the integrated circuit; and measuring the current supplied by the second selectable power supply line to determine quiescent current in the second section of the integrated circuit.

6. The method of claim 5, wherein the steps of measuring the current supplied by the first selectable power supply line and the second selectable power supply line comprise:

configuring automated test equipment to perform parametric measuring of the currents during a production test program.

7. The method of claim 5, wherein the first, second and third sections reside in the same region of the integrated circuit.

8. The method of claim 5, wherein the first selectable power supply switch and the second selectable power supply switch are comprised of complementary-metal-oxide-semiconductor pass transistors.

9. The method of claim 1, wherein the first section and second section are disposed in the same region of the integrated circuit.

10. The method of claim 1, wherein the integrated circuit is fabricated with a complementary-metal-oxide-semiconductor process.

11. The method of claim 1, the step of measuring current supplied by the first selectable power supply line comprises:

applying a test probe to a selectable power supply pad coupled to the first selectable power supply line.

12. An integrated circuit configurable to isolated defects producing unusual current levels, comprising:

a unitary power supply line;

a first section of the integrated circuit coupled to the unitary power supply line;

a second section of the integrated circuit coupled to the unitary power supply line;

a first power supply switch coupled between the second section and the unitary power supply line, the first power supply switch switchable between an open state and a closed state, the unitary power supply line configured to provide power to the first section and the second section in the closed state of the first power supply switch and the unitary power supply line further configured to be decoupled from the first section in the open state of the first power supply switch; and a first selectable power supply line configured to provide power to the first section.

13. The integrated circuit of claim 12, further comprising:

a pad for providing a power supply enable signal to the first power supply switch, the power supply enable signal if asserted placing the first power supply switch in the open state, the power supply enable signal if deasserted placing the first power supply switch in the closed state.

14. The integrated circuit of claim 12 fabricated in a complementary-metal-oxide semiconductor process.

15. The integrated circuit of claim 14, wherein the first power supply switch is a pass transistor.

16. The integrated circuit of claim 12, further comprising:

a third section of the integrated circuit coupled to the unitary power supply line;

a second selectable power supply line configured to provide power to the second section; and a second power supply switch coupled between the third section and the unitary power supply line, the second power supply switch switchable between an open state and a closed state, the unitary power supply line further configured to provide power to the third section in the closed state of the first power supply switch and the unitary power supply line further configured to be decoupled from the first section and second section in the open state of the second power supply switch.

17. The integrated circuit of claim 16, further comprising:

a pad for providing a second power supply enable signal to the second power supply switch for the second section, the second power supply enable signal if asserted placing the second power supply switch in the open state, the second power supply enable signal if deasserted placing the second power supply switch in the closed state.

18. The integrated circuit of claim 16 fabricated in a complementary-metal-oxide semiconductor process.

19. The integrated circuit of claim 18, wherein the first power supply switch and the second power supply switch are pass transistors.

20. The integrated circuit of claim 12, wherein the first section comprises random access memory.

21. The integrated circuit of claim 12, wherein the second section comprises digital logic.

22. An integrated circuit configurable to isolated defects producing unusual current levels, comprising:

a unitary power supply line;

a first section of the integrated circuit coupled to the unitary power supply line;

a second section of the integrated circuit coupled to the unitary power supply line;

a first power supply switch coupled between the first section and the unitary power supply line and coupled between the second section and the unitary power supply line, the first power supply switch having an enabled state and a disabled state, the unitary power supply line providing power to the first section and the second section in the enabled state of the first power supply switch and the unitary power supply line being decoupled from the first section and second section in the disabled state of the first power supply switch;

a selectable power supply line for the first section; and a second power supply switch coupled to the first section and the selectable power supply line for the first section, the second power supply switch having an enabled state and a disabled state, the selectable power supply line providing power to the first section in an enabled state of the second power supply switch and the selectable power supply line being decoupled from the first section in a disabled state of the second power supply switch.

* * * * *